United States Patent [19]

Powell

[11] Patent Number: 5,209,803

[45] Date of Patent: May 11, 1993

[54] PARALLEL PLATE REACTOR AND METHOD OF USE

[75] Inventor: Gary B. Powell, Petaluma, Calif.

[73] Assignee: Matrix Integrated Systems, Inc., Richmond, Calif.

[21] Appl. No.: 643,197

[22] Filed: Jan. 18, 1991

Related U.S. Application Data

[60] Division of Ser. No. 566,860, Aug. 10, 1990, which is a continuation of Ser. No. 238,642, Aug. 30, 1988, abandoned.

[51] Int. Cl.$^5$ ............................................. H01L 21/00
[52] U.S. Cl. ..................................... 156/345; 156/643; 118/723
[58] Field of Search ............... 156/345, 643; 118/723; 204/298.06, 298.07, 298.08, 298.33, 298.34

[56] References Cited

U.S. PATENT DOCUMENTS

| | | | |
|---|---|---|---|
| 4,680,086 | 7/1987 | Thomas et al. | 156/643 |
| 4,792,378 | 12/1988 | Rose et al. | 156/643 |
| 4,971,653 | 10/1990 | Powell et al. | 156/643 |
| 5,015,331 | 5/1991 | Powell | 156/643 |

FOREIGN PATENT DOCUMENTS

| | | |
|---|---|---|
| 55-086119 | 6/1980 | Japan . |
| 56-076242 | 6/1981 | Japan . |
| 60-060726 | 4/1985 | Japan . |

Primary Examiner—Brian E. Hearn
Assistant Examiner—George Goudreau
Attorney, Agent, or Firm—Donald J. Lisa

[57] ABSTRACT

A parallel plate reactor having a grounded grid disposed between an RF powered electrode and a grounded electrode upon which a substrate is disposed. A method of utilizing the above apparatus consists of etching the substrate using a composition of 30-100% $NF_3$ (nitrogen trifluoride) at 25 SCCM (standard cubic centimeter per minute) and 0-70% He (helium) at 75 SCCM to etch a layer of PECVD (plasma enhanced chemical vapor deposition) $Si_3N_4$ (silicon nitride). The etching takes place at 200 mtorr to 5 torr pressure and 50-400 watts RF power.

43 Claims, 2 Drawing Sheets

PARALLEL PLATE REACTOR AND METHOD OF USE

This application is a division of application Ser. No. 07/566,860 filed Aug. 10, 1990 which in turn a continuation of application Ser. No. 07/238,642 filed Aug. 30, 1988, now abandoned.

BACKGROUND OF THE INVENTION

The present invention relates, in general, to reactors used in semiconductor processing and, more particularly, to parallel plate reactors and their method of use.

Typically, semiconductor devices are manufactured by using combinations of differing layers of conductive, insulating, and semiconducting materials. It is often necessary to form openings in an upper substrate layer so that contact can be made with an underlying substrate layer. To accomplish this, a mask is deposited on the substrate. The mask is patterned to cover selected regions while leaving other regions exposed. The wafer is then subjected to a corrosive type of environment which will etch the exposed portion of the substrate. However, the etch materials also tend to etch the masks. It has been an ongoing objective of the industry to develop etching methods and apparatus which will selectively etch substrates. In other words, methods that will etch the substrate at a rate faster than the mask.

By increasing the differences in etch rates between the substrate and mask, the etching can be faster and permit the use of thinner masks. This provides an economic saving to the manufacturer. One type of selective etching is described in U.S. Pat. No. 4,568,410 invented by Stephen C. Thornquist.

Etchers come in two basic types, dry and wet. Wet etchers use a liquid element in which the substrates are submerged in order to etch the substrate. This type of etching is very traumatic and can cause damage to the substrates. Dry etchers use gas which forms a plasma to etch the substrate. Dry etching techniques are often referred to as reactive ion etching or plasma etching. In the prior art types of dry etchers, a plasma is formed by injecting a gas into an area between two electrodes. The reaction of the gas to the RF field produces a plasma which generates ions. The ions then collide with the substrates causing portions of the surface of the substrate to etch, or chip, off.

There are three basic types of reactors that use dry type etching to perform the etching function: barrel reactors, downstream reactors, and parallel plate reactors. The barrel and parallel plate type of reactors etch by generating a plasma envelope (or sheath). The ions generated in this plasma then bombard the substrate which is at a different, generally lower, potential than the electrodes. A disadvantage of these types of etchers is that the substrate is subjected to a much more intense ion bombardment because of the difference in potential between the plasma and the substrate. This makes it much more difficult to vary the etch rate between mask and substrate.

In the downstream reactors, the plasma is generated remotely from the substrate and then by normal diffusion reaches the substrate. A major historical disadvantage of these types of reactors is that they have been made of quartz which is more expensive and more subject to damage than the metal and ceramic type of reactors. Quartz is consumed, or etched away, in a fluorine based etch. This not only damages the chamber but can also leave residue on the substrate.

Accordingly, it is an object of the present invention to provide an improved apparatus and method that will overcome the above noted deficiencies.

A further object of the present invention is to provide a parallel plate reactor and method that improves the selectivity of etch ratios.

Another object of the present invention is to provide a parallel plate reactor which provides the advantages of wet etching in a dry etch environment.

Still another object of the present invention is to provide a parallel plate reactor and method that improves the etch rate.

Yet another object of the present invention is to provide a parallel plate reactor and method that requires a lower ratio of mask to substrate thickness.

Another object of the present invention is to provide a parallel plate reactor and method which improves the selective etching of a fluorine gas sources.

Still another object of the present invention is to provide a parallel plate reactor and method which will selectively etch low pressure chemical vapor deposition (LPCVD) nitride ($Si_3N_4$).

Yet another object of the present invention is to provide a parallel plate reactor and method which will etch phosphorous or boron doped oxide, isotropically.

SUMMARY OF THE INVENTION

A particular, preferred embodiment of the present invention consists of a parallel plate plasma reactor having a grounded grid disposed between an RF powered electrode and a grounded electrode upon which a substrate is disposed. The above apparatus is utilized in one particular gas composition of 30–100% $NF_3$ (nitrogen fluoride) at 25 SCCM (standard cubic centimeter per minute) and 0–70% He (helium) at 75 SCCM to etch a layer of PECVD (plasma enhanced chemical vapor deposition) $Si_3N_4$ (silicon nitride). The etching takes place at 200 mtorr to 5 torr pressure and 50–400 watts RF power.

DETAILED DESCRIPTION OF THE DRAWINGS

Figure 1:
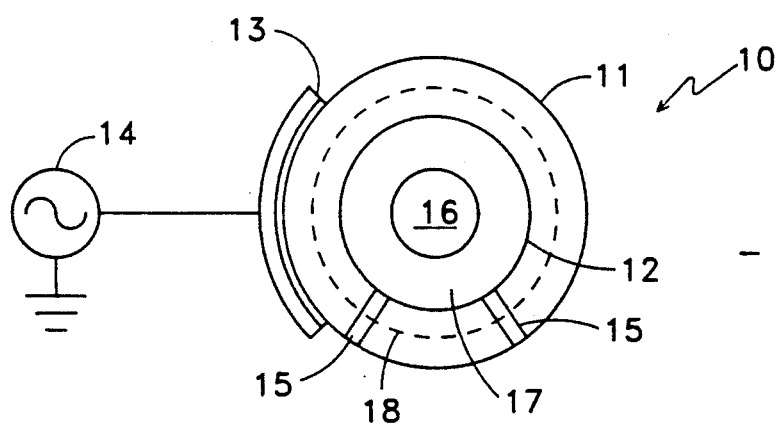
FIG. 1 is a simplified cross sectional view of a prior art barrel reactor.

Referring to FIG. 1, a simplified cross sectional view of a prior art barrel reactor, generally designated 10, is illustrated. Barrel reactor 10 consists of a quartz cylinder 11 having a cage 12 and an electrode 13. Electrode 13 is coupled to a power supply 14 which provides a 13.56 MHz signal. Cage 12 and electrode 13 are spaced apart by a pair of insulator legs 15. A substrate 16 is disposed within an area 17 defined by cage 12.

When operating, cage 12 assumes an electrical charge that reduces the ion flux experienced by substrate 16. A plasma envelope, whose perimeter is represented by dotted line 18, is generated within cylinder 11.

Because of the difference in potential between the plasma and substrate 16, and between cage 12 and substrate 16, ions bombard substrate 16 atomically chipping away at the surface. A drawback of barrel reactor 10 is that it is more difficult to selectively etch the substrate layer and mask where this type of chipping occurs.

Figure 2:
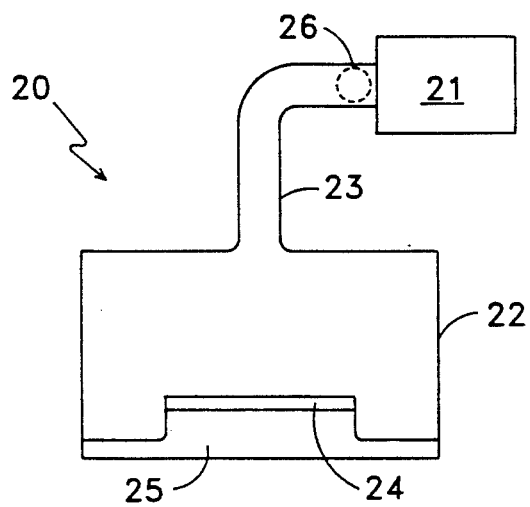
FIG. 2 is a simplified cross sectional view of a prior art downstream reactor.

In FIG. 2, a simplified cross sectional view of a downstream type of reactor, generally designated 20, is shown. Reactor 20 consists essentially of a power supply 21 and a chamber, generally quartz, 22 coupled together by a pipe 23, also generally made of quartz. In etcher 20, a substrate 24 is disposed on an insulator pedestal 25.

In operation, etcher 20 generates a plasma envelope 26 in pipe 23. The ions and neutrals generated diffuse along pipe 23 to chamber 22 where they etch substrate 24. While plasma source 26 is removed from substrate 24, there is no guarantee that plasma 26 and it's electrical potential are electrically confined near power source 21.

Figure 3:
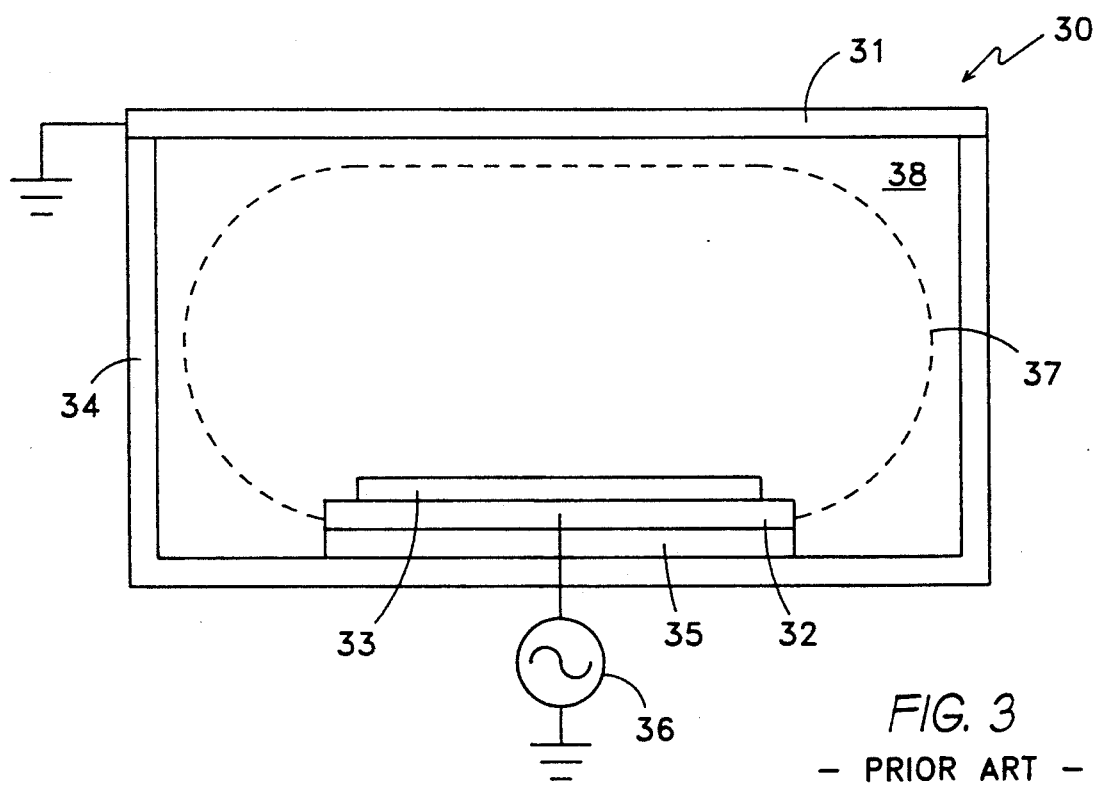
FIG. 3 is a simplified cross sectional view of a prior art parallel plate reactor.

A third type of reactor is a parallel plate reactor. A simplified cross sectional view of a prior art parallel plate reactor, generally designated 30, is shown in FIG. 3. Reactor 30 consists essentially of an upper electrode 31 and a lower electrode 32 having a substrate 33 disposed therebetween. Upper electrode 31 is coupled to a housing 34 to form a chamber 38. An insulator 35 is mounted on the base of housing 34. On insulator 35 is mounted lower electrode 32. Substrate 33 then rests on lower electrode 32.

In operation, lower electrode 32 is coupled to a power supply 36 and upper electrode 31 is coupled to ground. A plasma envelope, designated by dotted line 37, is generated that engulfs substrate 33. The difference in potentials between the plasma and substrate 33 causes substrate 33 to be subjected to high energy bombardment by the ions. This atomic chipping action provides less selectivity in etching than is provided by chemical etching.

Figure 4:
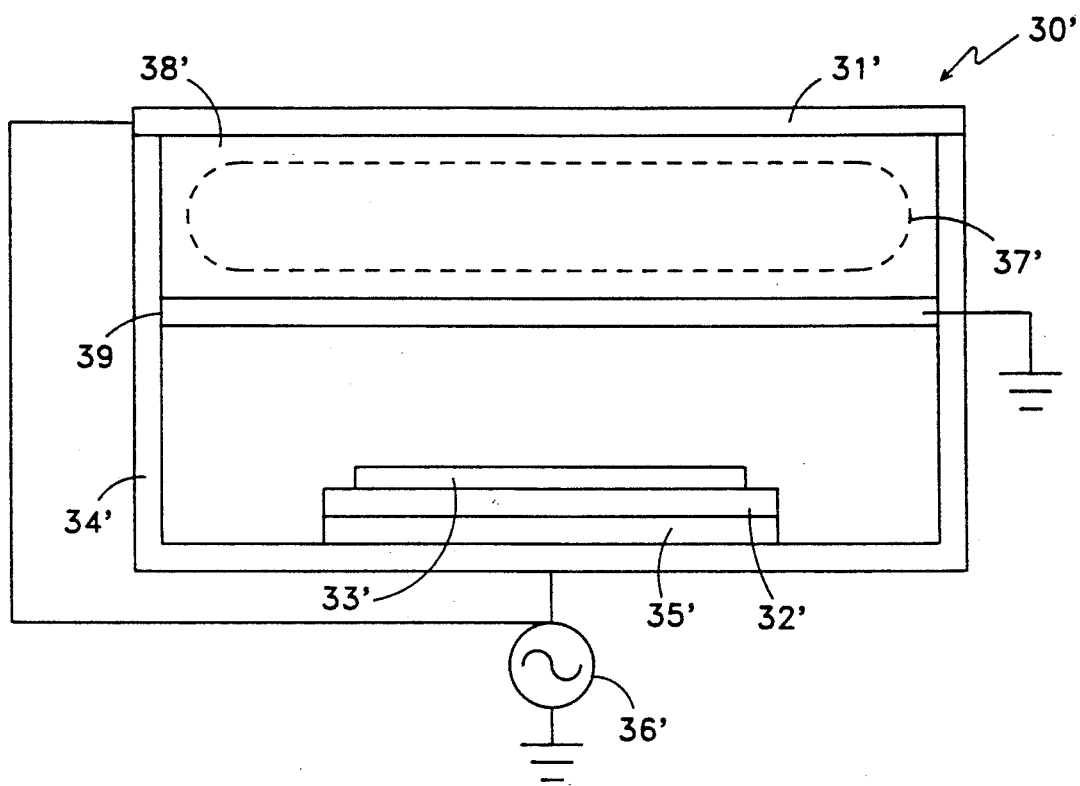
FIG. 4 is a simplified cross sectional view of a second prior art parallel plate reactor.

Another prior art parallel plate reactor is illustrated in FIG. 4. This second reactor has been designated as 30' with items similar to reactor 30 of FIG. 3 being designated in the same manner with the addition of a prime ('). A grid 39 has been disposed in chamber 38' of reactor 30'. Grid 39 is grounded while upper and lower electrodes, 31' and 32' respectively, are powered. This places substrate 33' in a situation where it still has an electrical potential different from that of electrodes 31' and 32'. Having a different potential results in the atomic chipping type of etch which is less selective.

Figure 5:
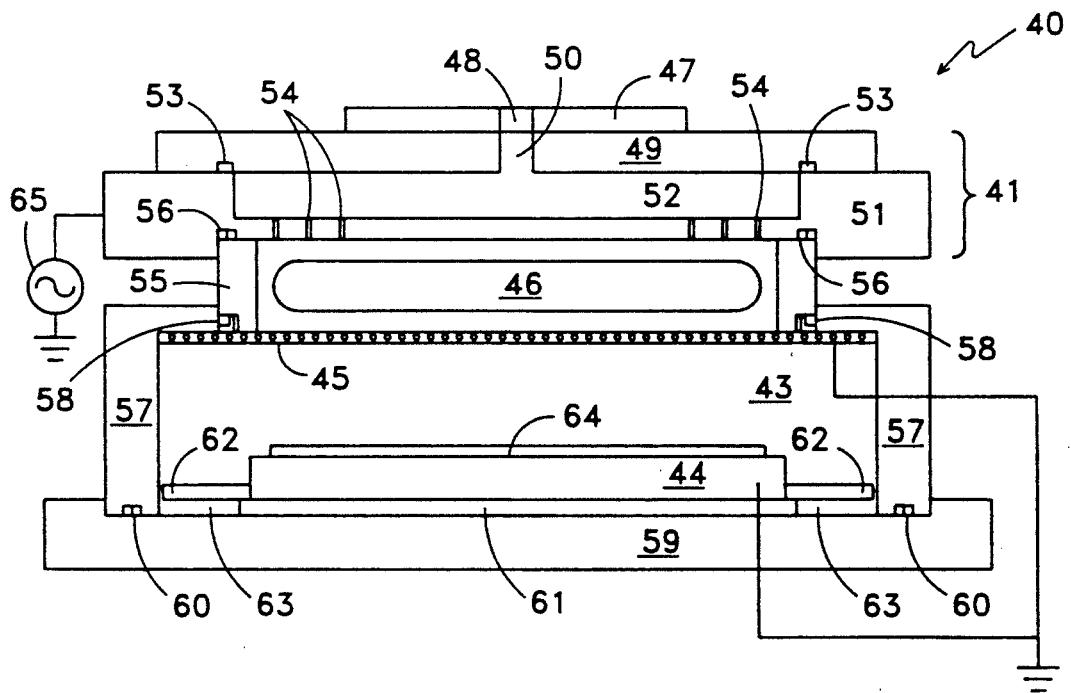
FIG. 5 is a cross sectional view of a parallel plate reactor embodying the present invention.

Referring now to FIG. 5, a cross sectional view of a parallel plate reactor, generally designated 40, embodying the present invention is illustrated. Reactor 40 consists primarily of an upper electrode portion 41, an upper RF chamber 42, a lower chamber 43, a lower electrode 44, and a grid 45. As illustrated in FIG. 4, a plasma envelope 46 is generated between grid 45 and electrode 41.

Electrode 41 consists of a cap 47 having a gas opening 48 therein. Cap 48 is mounted on a lid 49. Lid 49 also contains a gas opening 50 which coincides with opening 48 of cap 47. As is known in the art, lid 49 can contain vias for the circulation of water. The circulating water is used to cool reactor 40. Cap 47 acts as a cover for the water vias.

Lid 50 is disposed on a bottom disc 51 to form a gas mixing chamber 52 therebetween. An O'ring is disposed in an opening 53 formed between lid 49 and disc 51.

Disc 51 contains a plurality of openings 54 through which the reactant gases pass once mixed. The reactant gases pass through openings 54 into upper RF chamber 42 where plasma 46 is formed. The walls of chamber 42 are provided by an insulator 55. Insulator 55 is preferably made of aluminum oxide ($Al_2O_3$). An opening 56 is formed between disc 51 and insulator 55 in which a second O'ring is disposed.

Defining the bottom of chamber 42 is grid 45. Grid 45 is an electrically conductive perforated aluminum sheet type of grid, but may be made of many differing shapes. Grid 45 is coupled to the inner surface of body 57. Disposed about grid 45 and defining the circumference of lower chamber 43 is a chamber body 57. At the interface between chamber body 57 and insulator 55 is an O'ring opening 58.

Chamber body 57 is mounted on a base plate 59. At the interface between chamber body 57 and base plate 59 is an O'ring opening 60. Mounted on base plate 59, inside lower chamber 43, is an insulator 61. Insulator 61 is comprised of Aluminum Oxide ($Al_2O_3$). It should be noted here that since grid 45 and lower electrode 44 are at the same potential, insulator 61 is optional. Mounted on insulator 61 is lower electrode 44. Also mounted on insulator 61, disposed about the circumference of lower electrode 44, is a vacuum baffle 62. Vacuum baffle 62 forms an exhaust chamber 63 through which the gases in chamber 43 are removed.

A substrate 64, such as a semiconductor wafer, is disposed on the surface of lower electrode 44 such that a surface of substrate 64 is facing lower chamber 43.

In operation, reactant gases flow through openings 48 and 50 into chamber 52 where they are mixed. Typical gasses utilized consist of a fluorine (F) source gas such as $NF_3$, $CF_4$, or $SF_6$. The gases are then mixed in chamber 52 and passed through openings 54 into upper RF chamber 42. While in chamber 42, the gases are disposed between upper electrode 41, which is coupled to an RF power supply 65, and grid 45, which is grounded. This excites the gases forming plasma envelope 46. Ions formed by the plasma then migrate through grid 45 into chamber 43.

A key to the present invention is that grid 45 and lower electrode 44 are at the same potential, grounded in this embodiment. In the prior art, grid 45 and lower electrode 44 are at different potentials. The prior art utilizes this to attract the ions toward substrate 64 which causes an atomic chipping type etching when the ions impact the substrate. In the present invention, by having the lower electrode and the grid at the same potentials, the acceleration of the ions toward the substrate is removed. The present invention provides more of a chemical reaction type of etching. This chemical type of etching results in a much more selective etch between the mask and substrate layer.

Tests were run to demonstrate the enhanced selectivity of the present process. One test consisted of the etching of silicon nitride ($Si_3N_4$) deposited on a substrate using plasma enhanced chemical vapor deposition (PECVD). The process conditions were:

| Pressure: | 600 mtorr |
|---|---|
| Power: | 175 watts RF (13.56 mHz) |
| Gases: | $NF_3$ at 75 Sccm's |
| | He at 75 Sccm's |

The resulting etch rates (in Angstroms/minute) are listed below:

| MATERIAL | WITHOUT GRID | WITH GRID |
|---|---|---|
| Etch Rates: | | |
| PECVD ($Si_3N_4$) | >9000 A/min | >9000 A/min |
| Photoresist | >1000 A/min | <1000 A/min |
| Selectivity: | | |
| PECVD:Photoresist | 9:1 | >9:1 |

In the above process, it was found that: the power can be varied from 50 to 400 watts; the pressure can range between 200 millitorr and 5 torr; and the percentage of $NF_3$ in He ranged from 30% to 100%.

In a second test, an etch was performed on low pressure chemical vapor deposition (LPCVD) silicon nitride under the following conditions:

| | |
|---|---|
| Pressure: | 500 mtorr |
| Power: | 50 watts RF (13.56 mHz) |
| Gases: | $NF_3$ at 25 Sccm's |
| | $O_2$ at 50 Sccm's |
| Chuck Temp: | 60° C. |

Since this process has not been performed in a standard parallel plate etcher, only the results for a parallel plate etcher with grid grounded to the lower electrode are given. The results were:

| MATERIAL | WITH GRID |
|---|---|
| Etch Rates: | |
| LPCVD ($Si_3N_4$) | >1500 A/min |
| Photoresist | 200 A/min |
| Thermal Oxide | 150 A/min |
| Selectivity: | |
| LPCVD:Photoresist | >7.5:1 |
| LPCVD:Oxide | 10.0:1 |

In this process: the power can vary between 50 to 150 watts; the pressure can vary between 200 millitorr and 5 torr; and the gas mixes range from 20–80% of $NF_3$ in $O_2$.

A third process tested was that of etching isotropic, phosphorous and boron doped, oxide under the following conditions:

| | |
|---|---|
| Pressure: | 1.5 torr |
| Power: | 300 watts RF (13.56 mHz) |
| Gases: | $NF_3$ at 50 Sccm's |
| | He at 50 Sccm's |

Again, it is not possible to perform this process in a standard parallel plate reactor. Therefore, only the results are provided for a reactor of the type of the present invention. The results were:

| MATERIAL | WITH GRID |
|---|---|
| Etch Rates: | |
| Oxide | >2500 A/min |
| Photoresist | 250 A/min |
| Selectivity: | |
| Oxide:Photoresist | >10:1 |

In this process, the applicable process ranges are the same as the first process.

Thus, following a review of this specification, it will be apparent to one skilled in the art that there has been provided in accordance with the invention, a device and method that fully satisfies the objects, aims, and advantages set forth above.

While the invention has been described in conjunction with specific embodiments thereof, it will be evident that many alterations modifications and variations will be apparent to those skilled in the art in light of the forgoing description. Accordingly, it is intended to embrace all such alterations, modifications, and variations in the appended claims.

I claim:

1. An apparatus for etching substrates comprising:
   an upper electrode coupled to an R-F power source;
   a lower electrode;
   a grid having openings defined therein disposed between said upper electrode and said lower electrode, said grid and said upper electrode forming an upper chamber therebetween,
   said grid being clamped to have the same potential at all times as the lower electrode and forming with said lower electrode a lower chamber therebetween;
   a lid being coupled to a first surface of said upper electrode such that said lid and said upper electrode define a gas mixing chamber therebetween;
   an insulator coupled to a second surface of said upper electrode and to a first surface of said grid, said insulator, upper electrode, and grid defining said upper RF chamber therebetween;
   a wall of said lower chamber having a first end coupled to said insulator; and
   a base coupled to a second end of said lower chamber wall such that said base, lower chamber wall, and grid form said lower chamber therebetween, said lower electrode being disposed in the lower chamber on said base.

2. The apparatus of claim 1 further comprising a second insulator disposed between said base and said lower electrode.

3. The apparatus of claim 2 wherein said first and second insulators are comprised of aluminum oxide.

4. The apparatus of claim 1 further comprising a gas source coupled to said lid.

5. The apparatus of claim 4 wherein said gas source comprises a fluorine gas source.

6. The apparatus of claim 5 wherein said fluorine gas source comprises nitrogen trifluoride.

7. The apparatus of claim 5 wherein said fluorine gas source comprises carbon tetrafluoride.

8. The apparatus of claim 5 wherein said fluorine gas source comprises sulfur hexafluoride.

9. An apparatus for etching substrates comprising:
   an upper electrode coupled to an RF power source wherein said upper electrode is laterally supported by the structure of said apparatus;
   a lower electrode;
   a grid disposed between said upper electrode and said lower electrode, said grid and said upper electrode forming an upper chamber therebetween;
   said grid being clamped to have the same potential at all times as the lower electrode and forming with said lower electrode a lower chamber therebetween; and
   a gas mixing chamber formed in the upper chamber.

10. An apparatus for etching substrates comprising:

an upper electrode having a first surface, a second surface and defining an opening therein extending from said first surface to said second surface, said upper electrode electrically clamped to said grid, being coupled to a power source;

a lid coupled to said first surface of said upper electrode, said lid and said upper electrode defining a gas mixing chamber therebetween;

a first insulator having a first end coupled to said second surface of said upper electrode and a second end;

a conductive grid coupled to said second end of said first insulator, said conductive grid, first insulator, and upper electrode defining a plasma chamber therebetween;

a lower wall having a first end coupled to said second end of said first insulator and a second end;

a base having a first surface coupled to said lower wall, wherein said base, lower wall, and conductive grid define a lower chamber;

a lower electrode coupled to said first surface of said base and disposed in said lower chamber; and a reactant gas source coupled to said lid to provide a reactant gas to said gas mixing chamber.

11. The apparatus of claim 10 wherein said reactant gas is a fluorine source gas.

12. The apparatus of claim 11 wherein said fluorine gas source is nitrogen trifluoride.

13. The apparatus of claim 11 wherein said fluorine gas source is carbon tetrafluoride.

14. The apparatus of claim 11 wherein said fluorine gas source is sulfur hexafluoride.

15. An apparatus for etching substrates comprising:
an upper electrode coupled to an RF power source wherein said upper electrode is laterally supported by the housing structure of said apparatus;
a lower electrode;
a grid disposed between said upper electrode and said lower electrode, said grid and said upper electrode forming an upper chamber therebetween;
said grid, being clamped to have the same potential at all times as the lower electrode and forming with said lower electrode a lower chamber therebetween;
means for centrally introducing gases into said apparatus, and
a gas mixing chamber that is formed in said upper chamber.

16. An apparatus for etching substrates comprising:
an upper electrode laterally supported by a housing structure of said apparatus and coupled to an RF power source;
a lower electrode;
a grid disposed between said upper electrode and said lower electrode, said grid and said upper electrode forming an upper chamber therebetween; and
said grid being clamped to have the same potential at all times as the lower electrode and forming with said lower electrode a lower chamber therebetween.

17. The apparatus of claim 16 wherein the lateral support for the upper electrode is part of the side wall of the housing structure of said apparatus.

18. The apparatus of claim 16 wherein said RF power source is applied through the lateral support.

19. The apparatus of claim 16 further comprising a gas mixing chamber that is formed in said upper chamber.

20. The apparatus of claim 16 further comprising means for centrally introducing gases into said apparatus.

21. The apparatus of claim 16 wherein said upper electrode is part of the mixing chamber and the RF chamber.

22. An apparatus for etching substrates comprising:
an upper electrode coupled to an RF power source wherein said upper electrode is laterally supported by the structure of said apparatus;
a lower electrode;
a grid disposed between said upper electrode and said lower electrode, said grid and said upper electrode forming an upper chamber therebetween;
said grid being clamped to have the same potential at all times as the lower electrode and forming with said lower electrode a lower chamber therebetween; and
means for centrally introducing gases into said apparatus.

23. The apparatus of claims 9, 15, 16, or 22 further comprising a lid being coupled to a first surface of said upper electrode such that said lid and said upper electrode define a gas mixing chamber therebetween.

24. The apparatus of claim 23 further comprising a gas source coupled to said lid.

25. The apparatus of claim 24 wherein said gas source comprises a fluorine gas source.

26. The apparatus of claim 25 wherein said flourine gas source comprises nitrogen tetraflouride.

27. The apparatus of claim 25 wherein said flourine gas source comprises carbon tetraflouride.

28. The apparatus of claim 25 wherein said flourine gas source comprises sulfur hexaflouride.

29. The apparatus of claims 9, 22, 15, or 16 further comprising:
an insulator coupled to a second surface of said upper electrode and to a first surface of said grid, said insulator, upper electrode, and grid defining said upper RF chamber therebetween;
a wall of said lower chamber having a first end coupled to said insulator; and
a base coupled to a second end of said lower chamber wall such that said base, lower chamber wall, and grid form said lower chamber therebetween, said lower electrode being disposed in the lower chamber on said base.

30. The apparatus of claim 29 further comprising a second insulator disposed between said base and said lower electrode.

31. The apparatus of claim 30 wherein said first and second insulators are comprised of aluminum oxide.

32. An apparatus for etching substrates comprising:
an upper electrode at one end of the apparatus having a laterally supported central portion coupled to an RF power source;
a lower electrode;
a grid disposed between said central portion of the upper electrode and said lower electrode, said grid and said central portion of the upper electrode forming an upper chamber therebetween; and
said grid being clamped to have the same potential at all times as the lower electrode and forming with said lower electrode a lower chamber therebetween.

33. The apparatus of claim 32 wherein the lateral support for the upper electrode is a side wall portion of said apparatus.

34. The apparatus of claim 33 wherein said RF power source is applied through the lateral support.

35. The apparatus of claim 33 further comprising:
the upper electrode having an end portion having a central opening therethrough, the central, sidewall and end portions forming a gas mixing chamber.

36. An apparatus for etching substrates comprising:
a hollow, upper electrode closing one end of the apparatus, coupled to an RF power source and having a central opening in an end wall portion leading to the hollow,
a lower housing supporting a lower electrode closing the other end of the apparatus,
an insulative central housing connecting the upper electrode and lower housing,
a grid supported by a housing portion between the upper and lower electrodes,
the grid and upper electrode forming an upper chamber therebetween,
the grid and lower electrode forming a lower chamber therebetween and clamped to have the same potential at all times, and
a plurality of openings in a central wall portion of the upper electrode leading from the hollow to the upper chamber.

37. The apparatus of claim 16 wherein said housing and said upper electrode define a gas mixing chamber.

38. The apparatus of claim 37 further comprising a reactant gas source coupled to said housing such that a reactant gas passes through a gas opening defined by said housing into said gas mixing chamber.

39. The apparatus of claim 38 wherein said reactant gas comprises a fluorine source gas.

40. The apparatus of claim 39 wherein said fluorine source gas comprises nitrogen trifluoride.

41. The apparatus of claim 39 wherein said fluorine source gas comprises carbon tetraflouride.

42. The apparatus of claim 39 wherein said fluorine source gas comprises sulfur hexafluoride.

43. The apparatus of claim 38 further comprising the upper electrode having a plurality of symmetrically spaced openings therethrough.

* * * * *